(12) United States Patent
Huang et al.

(10) Patent No.: US 12,581,806 B2
(45) Date of Patent: Mar. 17, 2026

(54) DISPLAY PANEL AND PREPARATION METHOD OF DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Can Huang, Wuhan (CN); Wenxu Xianyu, Wuhan (CN); Chunpeng Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 387 days.

(21) Appl. No.: 18/498,621

(22) Filed: Oct. 31, 2023

(65) Prior Publication Data

US 2024/0414947 A1      Dec. 12, 2024

(30) Foreign Application Priority Data

Jun. 7, 2023      (CN) .......................... 202310672492.8

(51) Int. Cl.
*H10K 59/122*      (2023.01)
*H10K 59/12*      (2023.01)
*H10K 59/131*      (2023.01)

(52) U.S. Cl.
CPC ....... *H10K 59/122* (2023.02); *H10K 59/1201* (2023.02); *H10K 59/131* (2023.02)

(58) Field of Classification Search
CPC . H10K 59/122; H10K 59/1201; H10K 59/131
See application file for complete search history.

(56) References Cited

U.S. PATENT DOCUMENTS

| | | | | |
|---|---|---|---|---|
| 11,430,840 B2 * | 8/2022 | Kang | .................... | H10K 59/131 |
| 12,114,556 B2 * | 10/2024 | Lin | .................... | H10K 59/80522 |
| 2022/0384559 A1 * | 12/2022 | Zeng | .................... | H10K 59/122 |
| 2024/0057447 A1 * | 2/2024 | Lian | ................. | H10K 59/80522 |
| 2024/0130158 A1 * | 4/2024 | Hu | ........................ | H10K 59/122 |

* cited by examiner

*Primary Examiner* — Errol V Fernandes
(74) *Attorney, Agent, or Firm* — HSML P.C.

(57)      ABSTRACT

Embodiments of the present disclosure provide a display panel and a method for preparing a display panel. The display panel includes an array substrate, a planarization layer and a light-emitting device layer. The light-emitting device layer includes an anode, a functional layer, a cathode, and a contact electrode disposed, and the contact electrode includes a first contact portion, a second contact portion, and a third contact portion. Meanwhile, the functional layer and the cathode extend into the opening and is separated at the contact electrode, and the cathode on the side close to the display area is electrically connected with the contact electrode, and the functional layer on the side away from the display area is electrically connected with the contact electrode. An undercut structure is formed in the corresponding area corresponding to the opening, so that different electrodes can be disconnected and electrically connected.

10 Claims, 2 Drawing Sheets

DISPLAY PANEL AND PREPARATION METHOD OF DISPLAY PANEL

CROSS-REFERENCE TO RELATED APPLICATION

The present disclosure claims priority to and the benefit of Chinese Patent Application No. 202310672492.8, filed on Jun. 7, 2023, the disclosure of which is incorporated herein by reference in its entirety.

TECHNICAL FIELD

The present disclosure relates to the technical field of design and manufacture of display panels, and in particularly, to a display panel and a method for manufacturing a display panel.

BACKGROUND

With the development of the manufacturing technology of display panels, people put forward higher requirements for the display effect and comprehensive performance of display panel and display device.

An organic light-emitting diode (OLED) device generally consist of a substrate, an anode, a functional layer made of organic compounds, an organic light-emitting layer cathode with appropriate dopants, and the like. OLED devices have attracted more and more attention due to their low driving voltage, high brightness, wide viewing angle, and the ability to be used in full-color flat light-emitting displays. With the further expansion of the functions of the display device, OLED not only has the traditional display function, but usually need to have touch control and camera functions. However, in the related arts, when manufacturing and forming an OLED device, it usually has a wide frame structure to arrange a large number of signal lines, and some film layers inside the device are unreasonably arranged, making it impossible to achieve an extremely narrow frame structure and a full screen display effect. It is not conducive to the further improvement of the comprehensive performance of OLED display panel.

In view of the above, in the related arts, when manufacturing and forming an OLED device, it usually has a wide frame structure to arrange a large number of signal lines, and some film layers inside the device are unreasonably arranged, making it impossible to achieve an extremely narrow frame structure and a full screen display effect.

SUMMARY

In view of the above, embodiments of the present disclosure provide a display panel and a method for preparing a display panel, so as to effectively improve the situations in the related arts that manufacturing and forming an OLED device, the arrangement of some film layers inside the device are unreasonable, making it impossible to achieve an extremely narrow frame structure and a full screen display effect.

To solve the above technical problems, embodiments of the present disclosure provide a display panel including an array substrate, the array substrate includes a plurality of drive devices disposed in an array; the array substrate further includes:

a metal wiring layer disposed on one side of the array substrate;

a planarization layer disposed on the array substrate, the planarization layer is formed with at least one first opening thereon, and at least a part of the metal wiring layer is disposed within the first opening; and a light-emitting device layer disposed on the planarization layer, the light-emitting device layer includes a pixel definition layer, and a plurality of light-emitting devices separated by the pixel definition layer: each of the plurality of light-emitting devices includes an anode disposed on the planarization layer, an organic light-emitting layer disposed on the anode, and a cathode covering at least the organic light-emitting layer and the pixel definition layer; and each of the light-emitting devices is electrically connected with a corresponding one of the plurality of drive devices;

wherein a contact electrode is disposed in the first opening, the contact electrode includes a first contact portion, a second contact portion, and a third contact portion, the first contact portion is disposed in a same layer with the anode, the third contact portion is electrically connected with the metal wiring layer, and the second contact portion is connected with the first contact portion and the third contact portion; and wherein the pixel definition layer is formed with a second opening in the first opening: on a plane parallel to the array substrate, a distance between the first contact portion and one of the plurality of drive devices is smaller than a distance between the third contact portion and one of the plurality of drive devices, and the first contact portion and the second contact portion are part of sidewalls of the second opening: the functional layer and the cathode are both disconnected at the second opening, and the cathode is electrically connected with the contact electrode in the second opening.

According to some embodiments of the present disclosure, the display area includes at least one light-emitting pixel area and at least one non-light-emitting pixel area disposed on one side of the light-emitting pixel area, at least one light-emitting unit is disposed in the light-emitting pixel area, and the first opening is disposed in the non-light-emitting pixel area:

the functional layer is disposed between the cathode and the pixel definition layer and between the cathode and the organic light-emitting layer, the cathode covers the functional layer, and in the second opening, an end of the cathode on the side away from the light-emitting pixel area protrudes from the functional layer and is electrically connected with the contact electrode.

According to some embodiments of the present disclosure, distribution points corresponding to the contact electrodes are disposed in an array in the display area.

According to some embodiments of the present disclosure, the display panel further includes a frame area provided on one side of the display area, the display area including a first light-emitting unit close to the frame area and a first contact electrode provided on one side of the first light-emitting unit far from the frame area.

According to some embodiments of the present disclosure, the display panel further includes a frame area disposed on one side of the display area, the display area includes a first light-emitting unit close to the frame area and a first contact electrode disposed on one side of the first light-emitting unit away from the frame area.

According to some embodiments of the present disclosure, the metal wiring layer in the non-light-emitting pixel area includes a VSS signal line, and the metal wiring layer in the light-emitting pixel area includes a source/drain electrode:

wherein the contact electrode is electrically connected with the VSS signal line, and the source/drain electrode is disposed in a same layer as the VSS signal line.

According to some embodiments of the present disclosure, a part of the second contact portion is disposed on the array substrate, and a first accommodating cavity is formed among the first contact portion, the second contact portion and the cathode.

According to some embodiments of the present disclosure, the cathode and the functional layer extend into the first accommodating cavity, and the cathode is in contact with an inner wall of the second contact portion.

According to some embodiments of the present disclosure, the second opening is disposed in the display area, and the organic light-emitting layer is disposed in the second opening, the organic light-emitting layer is electrically connected with the anode and the functional layer.

According to some embodiments of the present disclosure, the pixel definition layer covers a part of the contact electrode, and the first contact portion is close to one side of the light-emitting pixel area, and ends of the functional layer and the cathode are flush with an end of the first contact portion.

According to a second aspect, the embodiments of the present disclosure further provide a method for preparing a display panel, including the steps of:

preparing an array substrate, and depositing a planarization layer on the array substrate;

patterning the planarization layer to form a plurality of first openings, depositing an anode at corresponding positions of the plurality of first openings corresponding to light-emitting pixels, depositing a contact electrode at corresponding positions of the plurality of first openings corresponding to a non-light-emitting pixel opening, and extending the contact electrode to a surface of the planarization layer, wherein the contact electrode including a first contact portion, a second contact portion, and a third contact portion, and the second contact portion being connected with the first contact portion and the third contact portion;

depositing a pixel definition layer on the planarization layer and etching to form a second opening on the pixel definition layer;

etching and removing the planarization layer in an area corresponding to the contact electrode, and forming an undercut structure;

depositing a functional layer on the pixel definition layer and depositing a cathode on the functional layer, wherein the cathode is electrically connected with the contact electrode in one of the plurality of first openings corresponding to the contact electrode; and packaging and forming the display panel.

According to a third aspect, embodiments of the present disclosure further provide a display device including a display panel provided in the embodiments of the present disclosure.

Compared with the related arts, embodiments of the present disclosure provide a display panel and a method for preparing a display panel. The display panel includes an array substrate, a planarization layer and a light-emitting device layer. The light-emitting device layer includes an anode, a functional layer, a cathode, and a contact electrode disposed in an area corresponding to an opening. The contact electrode includes a first contact portion, a second contact portion, and a third contact portion. At the same time, the functional layer extends into the opening and is separated at the contact electrode, and the cathode on the side close to the display area is electrically connected with the contact electrode, and the functional layer on the side away from the display area is electrically connected with the contact electrode. In embodiments of the present disclosure, an undercut structure for separation is formed between the contact portions at different positions and other film layers in the corresponding area of the opening, so that different electrodes can be disconnected and electrically connected, thereby effectively improving the structural design of the inner film layers in the display panel, and effectively shortening the frame and wiring width of the display panel through the undercut structure, thereby realizing a narrow-frame display panel.

BRIEF DESCRIPTION OF THE DRAWINGS

In order to more clearly describe the technical solutions in the specific embodiments of the present disclosure or in the related arts, hereinafter, the appended drawings used for describing the specific embodiments or the related arts will be briefly introduced. Apparently, the appended drawings described below are only directed to some embodiments of the present disclosure, and for a person skilled in the art, without expenditure of creative labor, other drawings can be derived on the basis of these appended drawings.

DETAILED DESCRIPTION

Figure 1A:
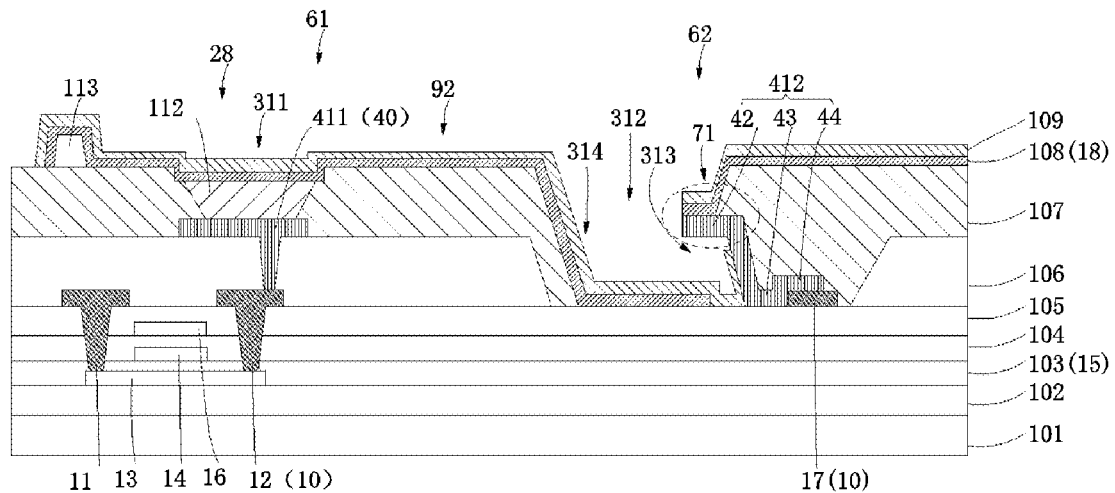
FIG. 1A is a schematic diagram of a film layer structure of a display panel according to some embodiments of the present disclosure.

Hereafter, the present disclosure will be described with reference to the accompanying drawings. The following description provides different embodiments or examples for implementing different structures of the present disclosure. In order to simplify the present disclosure, components and arrangements of specific examples are described below. In addition, the present disclosure provides examples of various specific processes and materials, which are applications of other processes that those skilled in the art may be aware. All the other embodiments, obtained by a person with ordinary skill in the art on the basis of the embodiments in the present disclosure without expenditure of creative labor, belong to the protection scope of the present disclosure.

In the description of the present disclosure, it should be noted that, terms such as "center", "longitudinal", "transverse", "length", "width", "thickness", "up", "down", "front", "back", "left", "right", "vertical", "horizontal", "top", "bottom", "inner", "outer", "clockwise", "counterclockwise" refer to the orientation or positional relationship based on the illustration of the appended drawings, and are only for the purpose of facilitating and simplifying the description of the present application, rather than indicating or implying that the apparatus or component referred to must have a particular orientation or must be configured or operated in a particular orientation, therefore should not be construed as a limitation towards the present application. In addition, terms such as "first", "second", "third" are merely for the purpose of description and should not be construed as an indication or implication of relative importance thereof or implying the number of indicated technical features.

With the continuous development of display panel preparation technology, people put forward higher requirements for the performance and display effect of display panel and display device.

In the process of preparing and forming the display panel, it is necessary to set a plurality of signal traces in a non-display area of the display panel, such as a frame area of the display panel, and realize the transmission of various control signals through different signal traces, such as VSS signal lines of the display panel. In the related arts, due to the large number of signal traces on the panel, when arranging a plurality of signal lines, the VSS signal lines are usually disposed in a non-display area of a display panel. Therefore, it is necessary to reserve a part of space in the non-display area to lay out the above VSS signal lines, thereby further increasing the non-display area of the display panel, which is not conducive to the realization of a narrow-frame display panel and the further improvement of the comprehensive performance of the display panel.

Embodiments of the present disclosure provide a display panel and a method for preparing a display panel, in which VSS signals are disposed in the display area, so as to effectively improve the problem in the related arts that the frame is wide due to unreasonable structural arrangement of the display panel, thereby effectively improving the comprehensive performance of the display panel. In embodiments of the present disclosure, the above VSS signal lines may be set as other signal lines, which will not be described in detail herein.

Figure 1B:
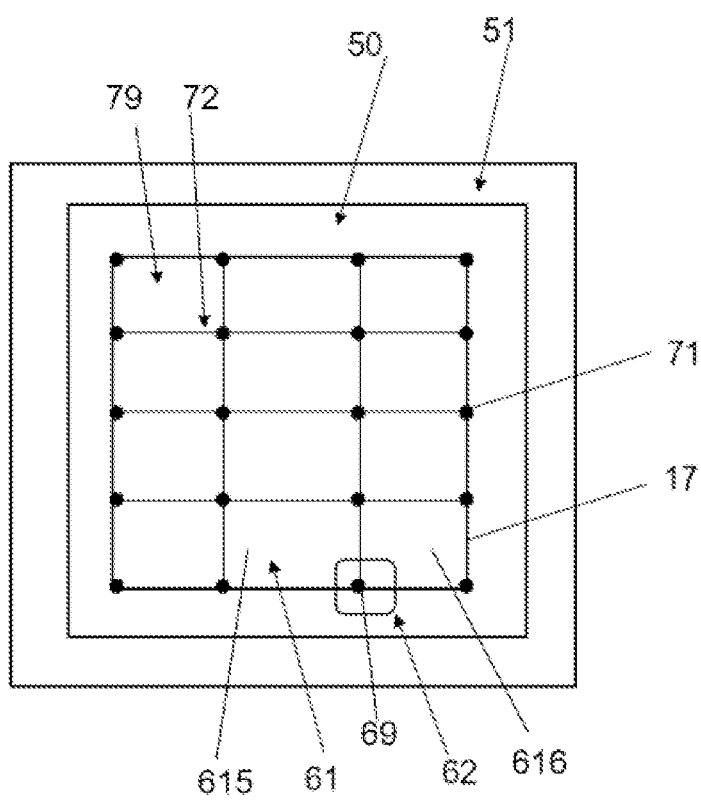
FIG. 1B is a schematic plan diagram of a display panel according to some embodiments of the present disclosure.

As shown in FIGS. 1A and 1B, FIG. 1A is a schematic diagram of a film layer structure of a display panel according to some embodiments of the present disclosure. FIG. 1B is a schematic plan diagram of a display panel according to some embodiments of the present disclosure. Combing with the structures in FIGS. 1A and 1B, in the embodiments of the present disclosure, the display panel may include a display area 50, which mainly displays images. At the same time, a frame area 51 is disposed on least one side of the display area 50, such as the periphery of the display area 50. Exemplarily, the GOA driving circuit of the display panel may be correspondingly disposed in the frame area 51. The transmission of the control signals is realized by the GOA driving circuit.

Furthermore, in the embodiments of the present disclosure, the display area 50 further includes a plurality of light-emitting pixel areas 61, and a non-light-emitting pixel area 62 disposed on one side of the light-emitting pixel area. In this embodiment, a plurality of light-emitting pixels 615 and a plurality of light-emitting units 616 are correspondingly provided in the light-emitting pixel area 61. The display of the panel is realized by emitting light from the light-emitting pixels 615 and the light-emitting units 616.

Furthermore, in the embodiments of the present disclosure, when the VSS signal lines of the display panel are disposed, the VSS signal lines are correspondingly disposed in the display area 50, for example, in the form of a grid shape, thereby effectively shortening the frame width of the frame area 51 and obtaining a narrow-frame panel.

Referring to FIG. 1A, in some embodiments of the present disclosure, the display panel includes a substrate 101, a buffer layer 102, an array substrate 15, a planarization layer 106, and a light-emitting device layer 18.

Exemplarily, the buffer layer 102 is disposed on the substrate 101 when the above-mentioned film layers are disposed. In some embodiments of the present disclosure, the buffer layer 102 may be configured as a stacked film layer, for example, the buffer layer 102 may include a first buffer layer and a second buffer layer disposed on the first buffer layer, thereby ensuring the buffer effect of the display panel and ensuring the performance of the display panel.

Furthermore, the array substrate 15 is disposed on the buffer layer 102. In some embodiments of the present disclosure, the array substrate 15 includes different film layers. In the following embodiments, the array substrate 15 may include a plurality of driving devices 92 disposed in an array. Meanwhile, the array substrate 15 also includes a first gate insulating layer 103, a second gate insulating layer 104, an interlayer dielectric layer 105, and a thin film transistor disposed between the film layers. The first gate insulating layer 103 is disposed on the buffer layer 102, the second gate insulating layer 104 is disposed on the first gate insulating layer 103, and the interlayer dielectric layer 105 is disposed on the second gate insulating layer 104.

Furthermore, when the thin film transistor structure is provided, the thin film transistor may include an active layer 13, a first gate 14, a second gate 16, and a metal wiring layer 10.

In the embodiments of the present disclosure, the active layer 13 is disposed on the buffer layer 102 and is completely covered by the first gate insulating layer 103. Meanwhile, the first gate 14 is disposed on the first gate insulating layer 103 and is completely covered by the second gate insulating layer 104, and the second gate 16 is disposed on the second gate insulating layer 104 and is completely covered by the interlayer dielectric layer 105.

Meanwhile, the metal wiring layer 10 may include a source-drain metal layer of the thin film transistor disposed in the display area, and a connection metal layer 17 disposed in the non-display area. The source-drain metal layer may include a source 11 and a drain 12, meanwhile the source-drain metal layer is disposed in the same layer as the connection metal layer 17. Exemplarily, the source 11 is disposed on the interlayer dielectric layer 105, the drain 12 is disposed on the interlayer dielectric layer 105, and the source 11 and the drain 12 are electrically connected with the active layer 13 through corresponding vias, thereby forming the thin film transistors in the embodiments of the present disclosure.

Furthermore, a light-emitting device layer 18 is further disposed. Exemplarily, the planarization layer 106 is disposed on the interlayer dielectric layer 105, and the light-emitting device layer 18 is disposed on the planarization layer 106.

In the embodiments of the present disclosure, the light-emitting device layer 18 is configured as a multi-film layer structure. Exemplarily, the light-emitting device layer 18 may include an anode 40, a pixel definition layer 107, a light-emitting layer 112, a functional layer 108, a cathode 109, and a contact electrode 412.

At the same time, the anode 40 further includes a first anode 411, which is correspondingly disposed in the light-emitting pixel area 61 of the display panel. The anode 40 is electrically connected with a metal wiring layer 10 on the array substrate. Optionally, a third opening 311 is disposed in the light-emitting pixel area 61, the first anode 411 and the light-emitting layer 112 are correspondingly disposed in the third opening 311, and the first anode 411 is electrically connected to the drain 12 in the array substrate through a corresponding via. When the display panel is normally operated, the thin film transistor transmits a control signal through the first anode 411.

In the embodiments of the present disclosure, when the third opening 311 is disposed, the third opening 311 penetrates through the pixel definition layer 107, and the third opening 311 is disposed corresponding to the drain 12 of the thin film transistor, so as to facilitate the connection between the first anode 411 and the drain 12.

Furthermore, the planarization layer 106 is disposed on the interlayer dielectric layer 105, and a first opening 312 is disposed on the planarization layer 106. Referring to FIG. 1A, the first opening 312 is correspondingly disposed in the non-light emitting pixel area 62, and the third opening 311 is correspondingly disposed in the light-emitting pixel area 61.

Meanwhile, the pixel definition layer 107 is disposed on the planarization layer 106, the first opening 312 penetrates through the planarization layer 106, and the pixel definition layer 107 covers a part of the first opening 312, so as to expose a part of the surface of the interlayer dielectric layer 105. In the embodiments of the present disclosure, the pixel definition layer 107 further includes a second opening 314. In the embodiments of the present disclosure, the second opening 314 is disposed corresponding to the first opening 312, and the second opening 314 is disposed inside the first opening 312. The contact electrode 412 and the connection metal layer 17 are respectively disposed in the first opening 312 corresponding to the non-light-emitting pixel area 62.

Exemplarily, the connection metal layer 17 is disposed on the interlayer dielectric layer 105, and the contact electrode 412 is electrically connected with the connection metal layer 17. In the embodiments of the present disclosure, during connection, this part of the contact electrode 412 is disposed on the connection metal layer 17 and extends to one side of the first opening 312 and to the pixel definition layer 107.

Furthermore, the functional layer 108 is disposed on the pixel definition layer 107 and covers the pixel definition layer 107, and the cathode 109 is disposed on the functional layer 108 and covers the functional layer 108. In the embodiments of the present disclosure, the functional layer 108 may be a light-emitting functional layer, for example a functional film layer such as a hole layer. Details are not described herein. In the embodiments of the present disclosure, the functional layer is disposed between the cathode and the pixel definition layer, and between the cathode 109 and the organic light-emitting layer 112, and the cathode covers the functional layer. In the second opening 314, an end of the cathode on the side away from the light-emitting pixel area protrudes from the light-emitting functional layer and is electrically connected with the contact electrode.

The functional layer 108 is electrically connected with the light-emitting layer 112 and is electrically connected with the cathode 109, and both the functional layer 108 and the cathode extend into the first opening 312 and are separated by the contact electrode 412 in the first opening 312.

In the embodiments of the present disclosure, in the area corresponding to the first opening 312, the pixel definition layer 107 covers the contact electrode 412 and a part of the connection metal 17. Meanwhile, the length of the orthographic projection of the cathode 109 on the array substrate is greater than the length of the orthographic projection of the functional layer 108 on the array substrate. On the side close to the light-emitting pixel area 61, such as the side close to the interlayer dielectric layer 105 in the first opening 312, the cathode 109 is electrically connected with the contact electrode 412, and at the same time, the contact electrode 412 is electrically connected with the connection metal layer 17. When the display panel is working, the connection metal layer 17 is equivalent to the second metal layer of the array substrate, so that transmission of cathode signals can be realized through communication among the cathode 109, the contact electrode 412, and the connection metal layer 17.

Meanwhile, on the side away from the light-emitting pixel area 61, such as the side away from the interlayer dielectric layer 105 in the first opening 312, the functional layer 108 is electrically connected with the contact electrode 412. In this way, the contact electrodes 412 are electrically connected with different film layers on both sides of the contact electrodes 412, so as to realize different functions. By disposing the contact electrodes 412 in the first opening 312 and bending the contact electrodes 412 upwards, the cathode and functional layers in the non-emitting pixel area 62 are vertically disposed and electrically connected in the display area, so as to realize the narrow-frame design of the display panel.

Furthermore, when the contact electrode 412 is disposed, the contact electrode 412 may include a first contact portion 42, a second contact portion 43, and a third contact portion 44. The first contact portion 42 is disposed on the side close to the light-emitting pixel area 61, the third contact portion 44 is disposed on the side away from the light-emitting pixel area 61, and the first contact portion 42 and the third contact portion 44 are electrically connected through the second contact portion 43. The contact electrode 412 extends upwardly and forms a Z-shaped structure.

In the embodiments of the present disclosure, when the above structure is disposed, the display panel further includes a frame area 51 disposed on one side of the display area 61. The display area 61 includes a first light-emitting unit 79 close to the frame area 51 and a first contact electrode 72, and the first contact electrode is disposed on one side of the first light-emitting unit 79 away from the frame area.

The contact electrode in a groove structure corresponding to the first light-emitting unit 79 is disposed in a regular Z-shaped structure, which effectively improves the space utilization rate of the display panel, reduces the width of the frame, achieves the effect of narrowing the frame, and ensures the performance of the panel.

Meanwhile, in the embodiments of the present disclosure, when the above different openings and the film structures are disposed, the distance between the first contact portion 42 and the light-emitting device 28 is less than the distance between the third contact portion and the light-emitting device 28 in the plane parallel to the array substrate, and the first contact portion and the second contact portion are part of the side walls of the second opening 314. Meanwhile, both the functional layer and the cathode are disconnected at the second opening 314, and in the second opening, the cathode is electrically connected with the contact electrode, for example, the cathode is electrically connected with the side surface of the second contact portion of the contact electrode.

In the embodiment of the present disclosure, at least a part of the third contact portion is electrically connected with the connection metal layer 17, such as being disposed on the connection metal layer 17. At the same time, the second contact portion 43 is at least partially disposed on the interlayer dielectric layer 105 and is in contact with the side surface of the connection metal layer 17 towards the opening 312, thereby ensuring a connection effect between the contact electrode and the connection metal layer 17.

In the embodiments of the present disclosure, the pixel definition layer covers a part of the contact electrode, and the first contact portion is close to one side of the light-emitting pixel area and the functional layer and the cathode are both disposed flush with an end of the first contact portion.

Furthermore, on the side close to the side of the first opening 312, the second contact portion 43 also has a certain inclination with the surface of the interlayer dielectric layer 105, that is, a part of the second contact portion 43 is inclined upward. Optionally, the included angle between the second contact portion 43 and the surface of the interlayer dielectric layer 105 is set to range from 60° to 85°. Optionally, the included angle is set to 65°, 75° or 80°, which may be selected according to the thickness of the inner film layer of different products.

In the embodiments of the present disclosure, the first contact portion 42 is disposed on the planarization layer 106 and is disposed close to one side of the first opening 312. In this way, since the second contact portion 43 is inclined upward, the height between the first contact portion 42 and the array substrate is greater than that between the third contact portion 44 and the array substrate.

Meanwhile, the first contact portion 42 and the second contact portion 43 form a first accommodation cavity 313 with the interlayer dielectric layer 105 corresponding to the bottom of the first opening 312. At this time, the first accommodation cavity 313 and the contact electrode form an undercut structure 71. In the embodiment of the present disclosure, when the functional layer 108 and the cathode 109 are deposited, the functional layer 108 and the cathode 109 will be separated at the first accommodation cavity 313. Referring to the schematic plan view in FIG. 1B, the undercut structure 71 is correspondingly disposed in the display area 50. Exemplarily, the undercut structure 71 is disposed in the non-light-emitting pixel area 62. Therefore, through the undercut structure 71, the cathode signals can be transmitted among the different layers of the cathode 109, the contact electrode 412 and the connection metal layer 17, and the light-emitting display and control of the display panel can be realized. According to the film layers in FIG. 1A and combined with the plane structure in FIG. 1B, in this disclosure, the distribution position points 69 corresponding to the contact electrodes 412 are disposed in an array in the display area 50.

Exemplarily, when the above film layers are disposed, both the cathode 109 and the functional layer 108 extend into the first accommodation cavity 313, and the extension length of the cathode 109 is larger than that of the functional layer 108. Meanwhile, the cathode 109 is in contact with the corresponding second contact portion 43 in the first accommodation cavity 313, and is electrically connected.

Furthermore, the first contact portion 42 may be disposed in parallel with the third contact portion 44. Meanwhile, the respective lengths of the first contact portion 42, the second contact portion 43, and the third contact portion 44 may be set according to the requirements of different products, for example, the length of the first contact portion 42 may be greater than the length of the third contact portion 44, so that the first contact portion 42 may extend for a long distance in the first opening 312. The functional layer 108 and the cathode 109 on the right side may cover the first contact portion 42 as much as possible. Meanwhile, the pixel definition layer 107 completely covers the second contact portion 43 and the third contact portion 44, and the pixel definition layer 107 covers a part of the first contact portion 42, so as to effectively move the length of the non-display area on the right side to the left side, thus achieving the purpose of reducing the width of the frame area.

In the embodiments of the present disclosure, when the undercut structure 71 formed by the contact electrode and other film layers is disposed, the undercut structure 71 can isolate the functional layer 108 from the cathode 109 in the first opening 312. Meanwhile, the connection metal layer 17 is electrically connected with the contact electrode 412 in the undercut structure 71, thereby realizing transmission of the control signals. Meanwhile, in the area corresponding to the first opening 312, one end edge of the first contact portion 42 protrudes from one end edge of the pixel definition layer 107. Optionally, the length of the protrusion can be set to range from 0.5 μm to 1.5 μm. Optionally, the length of the protrusion can be set to be 0.7 μm, 1 μm or 1.2 μm, so as to be set according to specifications of different products, and to ensure its quality and reliability.

Furthermore, in order to ensure the connection effect between the film layers in the undercut structure 71, in the embodiments of the present disclosure, the second contact portion 43 further includes a groove, wherein the groove is correspondingly disposed on one side of the third contact portion 44, for example, the groove is disposed in a corresponding area above the interlayer dielectric layer 105, so as to effectively improve bonding effect between the pixel definition layer 107 and the second contact portion 43, and effectively improve the fixing or supporting effect between the pixel definition layer 107 to the contact electrode, thereby ensuring the quality and comprehensive performance of the display panel.

In the embodiments of the present disclosure, in order to ensure the isolation effect of the undercut structure 71, when the above undercut structure 71 is disposed, in the area corresponding to the first opening 312, the ratio between the height of the contact electrode to the bottom of the first opening 312 and the width of the bottom of the opening 312 is set to range from 1.1 to 10. Optionally, the ratio of the two is set to be 2. In this case, the height from the contact electrode to the bottom of the opening 312 may be set to be 10 μm, and correspondingly, the width of the bottom of the opening 312 may be set to be 5 μm, or may be set according to the requirements of different products, and details are not described herein. In this way, the different film layers can be better isolated and the isolation effect can be ensured.

Furthermore, in the embodiments of the present disclosure, when the undercut structure 71 is disposed, the undercut structure 71 may be disposed in a U-shaped structure, a semi-circular structure, an arch structure, or the like. Exemplarily, the undercut structure 71 can be disposed according to requirements of different products, and details are not described herein.

In the embodiments of the present disclosure, the display panel further includes a support column 113, which is disposed at one side close to the light-emitting pixel area 61. Meanwhile, the functional layer 108 covers the support column 113, and finally forms the structure of the display panel disposed in the embodiments of the present disclosure.

Further, in the embodiments of the present disclosure, a method for preparing a display panel is further provided, which includes the steps of:

preparing an array substrate, and depositing a planarization layer on the array substrate;

patterning the planarization layer to form a plurality of first openings, depositing an anode at corresponding positions of the plurality of first openings corresponding to light-emitting pixels, depositing a contact electrode at corresponding positions of the plurality of first openings corresponding to a non-light-emitting pixel opening, and extending the contact electrode to a surface of the planarization layer, wherein the contact electrode comprising a first contact portion, a second contact portion, and a third contact portion, and the second contact portion being connected with the first contact portion and the third contact portion;

depositing a pixel definition layer on the planarization layer and etching to form a second opening on the pixel definition layer;

etching and removing the planarization layer in an area corresponding to the contact electrode, and forming an undercut structure;

depositing a functional layer on the pixel definition layer and depositing a cathode on the functional layer, wherein the cathode is electrically connected with the contact electrode in one of the plurality of first openings corresponding to the contact electrode; and packaging and forming the display panel.

Figure 2:
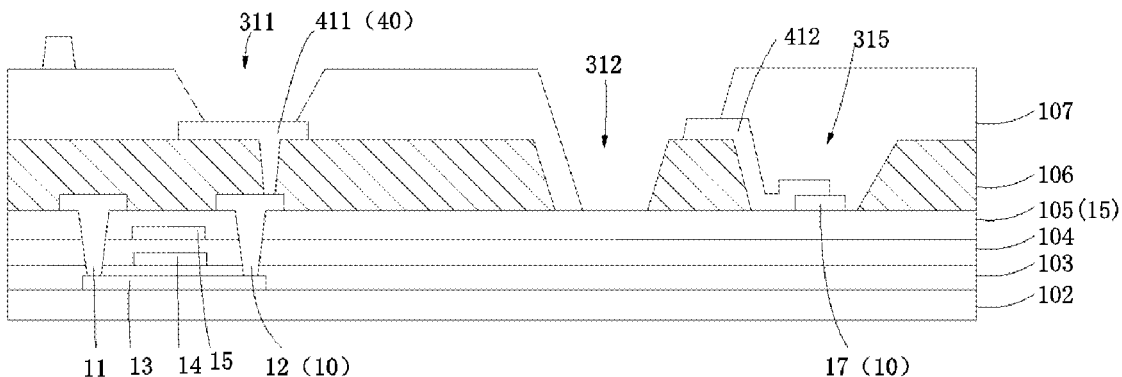
FIG. 2 is a schematic diagram of a corresponding film layer structure during preparation of the display panel according to some embodiments of the present disclosure.

The above preparation steps are illustrated by the following different film layers. As shown in FIG. 2, which is a schematic diagram of a corresponding film layer structure during preparation of the display panel according to some embodiments of the present disclosure. In connection with the film layers in FIG. 1A, when preparing and forming the display panel in the embodiments of the present disclosure, each film layer corresponding to the array substrate 15 is sequentially prepared on the substrate. The array substrate 15 may be disposed according a conventional structure, and details are not described herein.

After the preparation of the array substrate is completed, a planarization layer 106 is prepared on the array substrate. After the preparation of the planarization layer 106 is completed, the planarization layer 106 is etched, for example, the planarization layer 106 is patterned, and a plurality of openings are formed. In the embodiments of the present disclosure, a third opening 311 is formed in the light-emitting pixel area, meanwhile, other openings are formed in the non-light-emitting pixel area, for example, a first opening 312 and a fourth opening 315, so as to expose the connection metal layer 17 at the position of the fourth opening 315 and the anode 411 at the first opening 311 for subsequent electrical connection with the other electrodes.

After etching is completed, the first anode 411 and the contact electrode 412 are prepared on the planarization layer 106. The first anode 411 and the contact electrode 412 may be formed by using the same process. When preparing the contact electrode 412, the contact electrode 412 is correspondingly disposed in the fourth opening 315, and extends to the upper surface of the planarization layer 106 along the side edge of the planarization layer 106 corresponding to the fourth opening 315, so as to form a bent structure with a certain height.

After the preparation of the above film layers, a pixel definition layer 107 is formed, which covers the fourth opening 315, the first anode electrode 411, and a part of the contact electrode 412. Further, the pixel definition layer 107 is etched.

Figure 3:
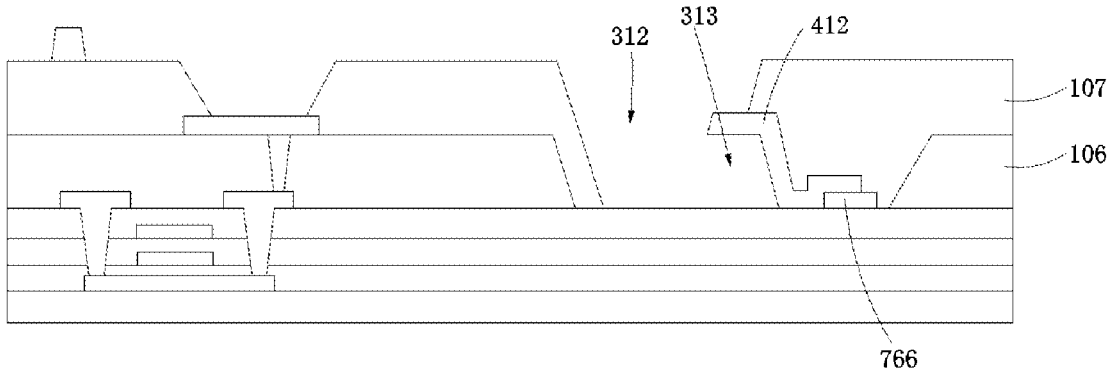
FIG. 3 is a schematic diagram of another corresponding film layer structure during preparation of the display panel according to some embodiments of the present disclosure.
Figure 4:
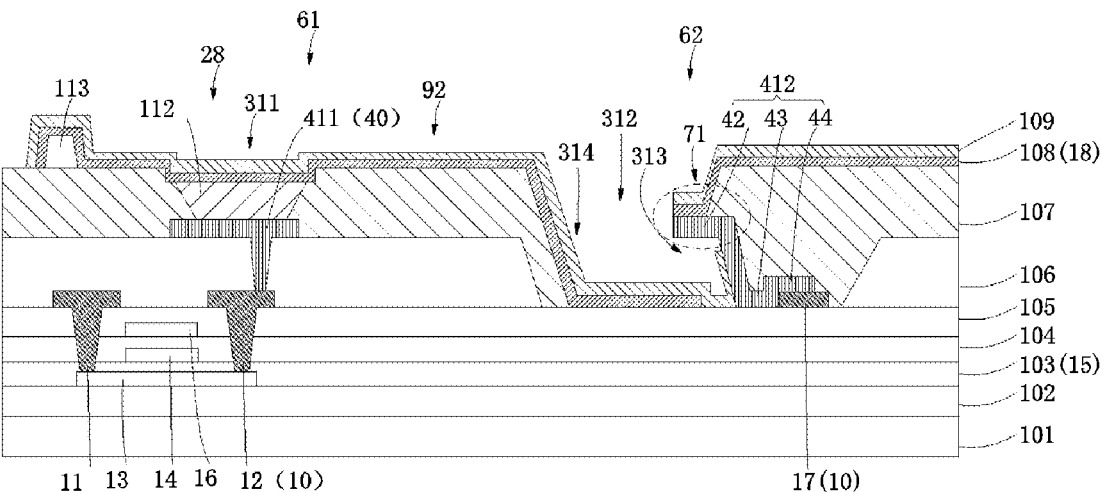
FIG. 4 is a schematic structural diagram of another display panel according to some embodiments of the present disclosure.

After the etching of the pixel definition layer 107 is completed, the etching is continued. As shown in FIG. 3 and FIG. 4, FIG. 3 is a schematic diagram of another corresponding film layer structure during preparation of the display panel according to some embodiments of the present disclosure, and FIG. 4 is a schematic structural diagram of another display panel according to some embodiments of the present disclosure. Combined with the preparation process in FIG. 2, at this time, the planarization layer 106 covered under the contact electrode 412 is etched away, and the redundant planarization layer in this area is etched away, thus finally forming the structure of the second opening 314 of the pixel definition layer in the embodiments of the present disclosure.

Exemplarily, during etching, a gas etching process may be used, for example, a fluorine-containing etching gas may be added to the etching gas, and optionally, the etching gas is $SF_6$ or $CF_4$ and other gases. Meanwhile, during the etching process, the lateral etching rate of the planarization layer 106 etching is increased until the corresponding planarization layer 106 under the contact electrode 412 is completely etched away. After the etching is completed, the first accommodation cavity 313 and the corresponding undercut structure are formed in the corresponding area of the second opening 314. The first accommodation cavity 313 has a certain depth-width ratio, thereby effectively ensuring the separation effect of the undercut structure on the other film layers.

Furthermore, during the etching process of the pixel definition layer 107 and the planarization layer 106, the pixel definition layer 107 covers a part of the contact electrode 412, and at the same time, the corresponding planarization layer 106 under the contact electrode 412 is completely etched, so that the first accommodation cavity 313 communicates with the second opening 314.

After the preparation of the undercut structure is completed, other film layers are sequentially prepared on the pixel definition layer 107, for example, a light-emitting layer is deposited in the display area, and a functional layer 108 and a cathode 109 are deposited on the pixel definition layer 107. During the preparation process, since an undercut structure is formed in the display panel, the undercut structure has a certain height. Therefore, the functional layer 108 and the cathode 109 will be disconnected by the undercut structure, and a discontinuous film layer will be formed.

In the embodiments of the present disclosure, when the above-mentioned undercut structure is disposed, and the undercut structure is correspondingly disposed in the display area, and the distribution position and the distribution density of the undercut structure can be set according to specifications of different products. The connection between the different film layers is realized by the undercut structure, and the transmission of the VSS signals is realized. In the embodiments of the present disclosure, the contact electrode is electrically connected to the VSS signal lines 766, and the source-drain metal layer is disposed in the same layer as the VSS signal lines 766, thereby realizing a narrow-frame design of the display panel.

Furthermore, after the preparation of the above-mentioned cathode 109 is completed, a light extraction layer may be further deposited on the cathode 109 and the light extraction layer can be sealed at the same time, and finally the display panel provided in the embodiments of the present disclosure can be formed.

Furthermore, the embodiments of the present disclosure further provide a display device including the display panel provided in the embodiments of the present disclosure. The display panel is disposed according to the film layers provided in the embodiments of the present disclosure, so that the film layers in the display panel can be improved, the narrow-frame design of the display panel can be realized, and the comprehensive performance of the display panel and the device can be effectively improved.

In the embodiments of the present disclosure, the display panel and its corresponding display device may be any product or component that can be displayed or operated by touch, such as a mobile phone, a computer, an electronic paper, a display, a notebook computer, or a digital photo frame, and the specific type of which is not specifically limited.

In view of the foregoing, the display panel and the method for preparing the display panel provided in embodiments of the present disclosure have been described in detail above, and the principles and embodiments of the present disclosure are described by using specific examples herein. Descriptions of the above examples are merely intended to help understand the technical solutions and core ideas of the present disclosure. Although the present disclosure has been described in terms of preferred embodiments, the foregoing preferred embodiments are not intended to limit the present disclosure. Those skilled in the art will be able to make various changes and modifications without departing from the spirit and scope of the present disclosure, and therefore the scope of the present disclosure is based on the scope defined in the claims.

What is claimed is:

1. A display panel comprising a display area, wherein the display panel comprises an array substrate comprising a plurality of drive devices disposed in an array, the array substrate further comprises:

a metal wiring layer disposed on one side of the array substrate;

a planarization layer disposed on the array substrate, the planarization layer is formed with at least one first opening thereon, and at least a part of the metal wiring layer is disposed within the first opening; and a light-emitting device layer disposed on the planarization layer, the light-emitting device layer comprises a pixel definition layer, and a plurality of light-emitting devices separated by the pixel definition layer; each of the plurality of light-emitting devices comprises an anode disposed on the planarization layer, an organic light-emitting layer disposed on the anode, and a cathode covering at least the organic light-emitting layer and the pixel definition layer; and each of the light-emitting devices is electrically connected with a corresponding one of the plurality of drive devices;

wherein a contact electrode is disposed in the first opening, the contact electrode comprises a first contact portion, a second contact portion, and a third contact portion, the first contact portion is disposed in a same layer with the anode, the third contact portion is electrically connected with the metal wiring layer, and the second contact portion is connected with the first contact portion and the third contact portion; and wherein the pixel definition layer is formed with a second opening in the first opening; on a plane parallel to the array substrate, a distance between the first contact portion and one of the plurality of drive devices is smaller than a distance between the third contact portion and one of the plurality of drive devices, and the first contact portion and the second contact portion are part of sidewalls of the second opening; the functional layer and the cathode are both disconnected at the second opening, and the cathode is electrically connected with the contact electrode in the second opening.

2. The display panel according to claim 1, wherein the display area comprises at least one light-emitting pixel area and at least one non-light-emitting pixel area disposed on one side of the light-emitting pixel area, at least one light-emitting unit is disposed in the light-emitting pixel area, and the first opening is disposed in the non-light-emitting pixel area;

the functional layer is disposed between the cathode and the pixel definition layer and between the cathode and the organic light-emitting layer, the cathode covers the functional layer, and in the second opening, an end of the cathode on the side away from the light-emitting pixel area protrudes from the functional layer and is electrically connected with the contact electrode.

3. The display panel according to claim 1, wherein distribution points corresponding to the contact electrode are disposed in an array in the display area.

4. The display panel according to claim 1, further comprising a frame area disposed on one side of the display area, the display area comprises a first light-emitting unit close to the frame area and a first contact electrode disposed on one side of the first light-emitting unit away from the frame area.

5. The display panel according to claim 1, wherein the metal wiring layer in the non-light-emitting pixel area comprises a VSS signal line, and the metal wiring layer in the light-emitting pixel area comprises a source/drain electrode;

wherein the contact electrode is electrically connected with the VSS signal line, and the source/drain electrode is disposed in a same layer as the VSS signal line.

6. The display panel according to claim 1, wherein a part of the second contact portion is disposed on the array substrate, and a first accommodating cavity is formed among the first contact portion, the second contact portion and the cathode.

7. The display panel according to claim 6, wherein the cathode and the functional layer extend into the first accommodating cavity, and the cathode is in contact with an inner wall of the second contact portion.

8. The display panel according to claim 1, wherein the second opening is disposed in the display area, and the organic light-emitting layer is disposed in the second opening, the organic light-emitting layer is electrically connected with the anode and the functional layer.

9. The display panel according to claim 8, wherein the pixel definition layer covers a part of the contact electrode, and the first contact portion is close to one side of the light-emitting pixel area, and ends of the functional layer and the cathode are flush with an end of the first contact portion.

10. A method for preparing a display panel, comprising steps of:

preparing an array substrate, and depositing a planarization layer on the array substrate;

patterning the planarization layer to form a plurality of first openings, depositing an anode at corresponding positions of the plurality of first openings corresponding to light-emitting pixels, depositing a contact electrode at corresponding positions of the plurality of first openings corresponding to a non-light-emitting pixel opening, and extending the contact electrode to a surface of the planarization layer, wherein the contact electrode comprising a first contact portion, a second contact portion, and a third contact portion, and the second contact portion being connected with the first contact portion and the third contact portion;

depositing a pixel definition layer on the planarization layer and etching to form a second opening on the pixel definition layer, etching and removing the planarization layer in an area corresponding to the contact electrode, and forming an undercut structure;

depositing a functional layer on the pixel definition layer and depositing a cathode on the functional layer, wherein the cathode is electrically connected with the contact electrode in one of the plurality of first openings corresponding to the contact electrode; and packaging and forming the display panel.

* * * * *